United States Patent
Ohara et al.

(10) Patent No.: US 11,459,996 B2
(45) Date of Patent: *Oct. 4, 2022

(54) ELECTRONIC CONTROL UNIT

(71) Applicant: Hitachi Automotive Systems, Ltd., Hitachinaka (JP)

(72) Inventors: Yuri Ohara, Hitachinaka (JP); Yasuo Shima, Hitachinaka (JP); Masahiro Doi, Hitachinaka (JP); Takeo Yamashita, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/274,228

(22) PCT Filed: Aug. 8, 2019

(86) PCT No.: PCT/JP2019/031321
§ 371 (c)(1),
(2) Date: Mar. 8, 2021

(87) PCT Pub. No.: WO2020/059351
PCT Pub. Date: Mar. 26, 2020

(65) Prior Publication Data
US 2021/0317811 A1    Oct. 14, 2021

(30) Foreign Application Priority Data

Sep. 21, 2018 (JP) .............................. JP2018-177036

(51) Int. Cl.
*H01H 47/00* (2006.01)
*F02P 17/00* (2006.01)
(Continued)

(52) U.S. Cl.
CPC ............ *F02P 17/00* (2013.01); *G01R 31/005* (2013.01); *H01F 7/064* (2013.01)

(58) Field of Classification Search
None
See application file for complete search history.

(56) References Cited

U.S. PATENT DOCUMENTS

2009/0079435 A1   3/2009 Nakata
2009/0284205 A1*  11/2009 Yamamoto ............... H02P 7/04
                                                318/490

FOREIGN PATENT DOCUMENTS

| JP | 2001-253307 A | 9/2001 |
| JP | 2009-077542 A | 4/2009 |
| JP | 2014-046730 A | 3/2014 |

OTHER PUBLICATIONS

International Search Report with English translation and Written Opinion issued in corresponding application No. PCT/JP2019/031321 dated Dec. 10, 2019.

* cited by examiner

*Primary Examiner* — Stephen W Jackson
(74) *Attorney, Agent, or Firm* — Foley & Lardner LLP

(57) ABSTRACT

Provided is an electronic control unit capable of performing a high-accurate failure diagnosis in a short time as an electronic control unit having a failure diagnosis function. A load drive circuit that drives a load, a control circuit that controls the load drive circuit, and a diagnosis circuit that diagnoses an output state of the load drive circuit and outputs a diagnostic result to the control circuit are provided. The diagnosis circuit outputs a diagnosis completion flag indicating whether or not there is a diagnosis opportunity to the control circuit.

15 Claims, 8 Drawing Sheets

(51) Int. Cl.
*G01R 31/00* (2006.01)
*H01F 7/06* (2006.01)

ELECTRONIC CONTROL UNIT

TECHNICAL FIELD

The present invention relates to control of an electronic control unit, and particularly relates to a technology effective by being applied to an in-vehicle electronic control unit having a failure diagnosis function.

BACKGROUND ART

An electronic control block of a vehicle includes various sensors that detect necessary information such as states and driving environments of an engine, an electronic control unit (ECU) that instantly performs an arithmetic operation on kinds of information obtained from these sensors and outputs optimum control information, and an actuator (drive device) that is driven according to the optimum control information, and optimum control of each electronic control system is performed in cooperation with each other.

Actuators such as an engine igniter (ignition device), an injector (fuel injection device), and an anti-lock brake system (ABS) are electrical loads, and ECUs are load drive devices that drive these electrical loads.

As mentioned above, the ECU (load drive device) performs optimal control based on signals from the sensors. However, an in-vehicle failure diagnosis function (OBD: On-Board Diagnostics) of diagnosing defects such as a disconnection and a function abnormality of the sensor is provided in order for the vehicle to demonstrate safety and environmental performance.

An abnormality diagnosis in the load drive device may be necessary to detect a supply fault, a ground fault, or a disconnection. In general, it is determined that an output of a driver is normal or abnormal by monitoring a voltage and a current of an output of a driver (drive circuit) and comparing a monitored value with a threshold value. A diagnostic result is transmitted to a control circuit such as a microcomputer that controls the driver, and control corresponding to the diagnostic result such as control of stopping an operation of the driver is performed when the result is abnormal.

It is necessary to perform abnormality diagnosis and driver control based on a result thereof especially for the vehicle under certainty, fastness, and a wide range of driving conditions from safety requirements and tightening of exhaust regulations, and it is necessary to prepare countermeasures corresponding to each case.

As a specific example, in a defect such as a supply fault abnormality of a low-side driver, a large current continues to flow in a driver circuit, and thus, a serious failure such as fusion cutting of a wiring pattern may be caused. As a related art of more suddenly stopping the driver in order to avoid such a failure, there is a method of immediately deactivating the driver before notifying the control circuit when the defect is detected.

For example, PTL 1 describes that "a diagnosis start signal is input from a microcontroller via serial communication. when the diagnosis start signal is received, a driver IC reads an ON or OFF state of each driver circuit from a ROM to a register group. Each driver diagnosis circuit performs diagnosis in the ON or OFF state according to a value of a register. When the defect is detected at this stage, information is written to a diagnostic register group that stores a failure mode and a drive circuit number. The drive circuit in which the defect is detected is deactivated and notified to the microcontroller via high-speed serial communication based on this data".

CITATION LIST

Patent Literature

PTL 1: JP 2014-46730 A

SUMMARY OF INVENTION

Technical Problem

In the diagnostic method of the related art described above, when a voltage is monitored as means of diagnosing an abnormality, since a difference between a normal state and an abnormal state cannot be confirmed when the output is connected to GND or a power supply via a switch that drives the load in a state in which the driver (drive circuit) is the ON state, the diagnosis can be performed only when the drive circuit is in the OFF state.

Meanwhile, even when a current is detected, the diagnosis cannot be performed only in the ON state in which the current flows through the driver (drive circuit). Thus, in the related art, when there is no diagnosable opportunity of the ON or OFF state of the driver, the diagnostic result is transmitted to the control circuit as normal even though the result is not confirmed.

The control circuit determines the state of the output of the driver based on a plurality of normal or abnormal diagnosis results from the driver. However, since an erroneous "normal" diagnostic result may be transmitted for the above reasons, there is a problem that it takes time to perform reliable determination.

Therefore, an object of the present invention is to provide an electronic control unit capable of performing a high-accurate failure diagnosis in a short time as an electronic control unit having a failure diagnosis function.

Solution to Problem

In order to solve the above problems, an electronic control unit according to the present invention includes a load drive circuit that drives a load, a control circuit that controls the load drive circuit, and a diagnosis circuit that diagnoses an output state of the load drive circuit, and outputs a diagnostic result to the control circuit. The diagnosis circuit outputs a diagnosis completion flag indicating whether or not there is a diagnosis opportunity to the control circuit.

Advantageous Effects of Invention

According to the present invention, it is possible to realize an electronic control unit capable of performing a high-accurate failure diagnosis in a short time as an electronic control unit having a failure diagnosis function.

Other objects, configurations, and effects will be made apparent in the following descriptions of the embodiments.

DESCRIPTION OF EMBODIMENTS

Figure 1:
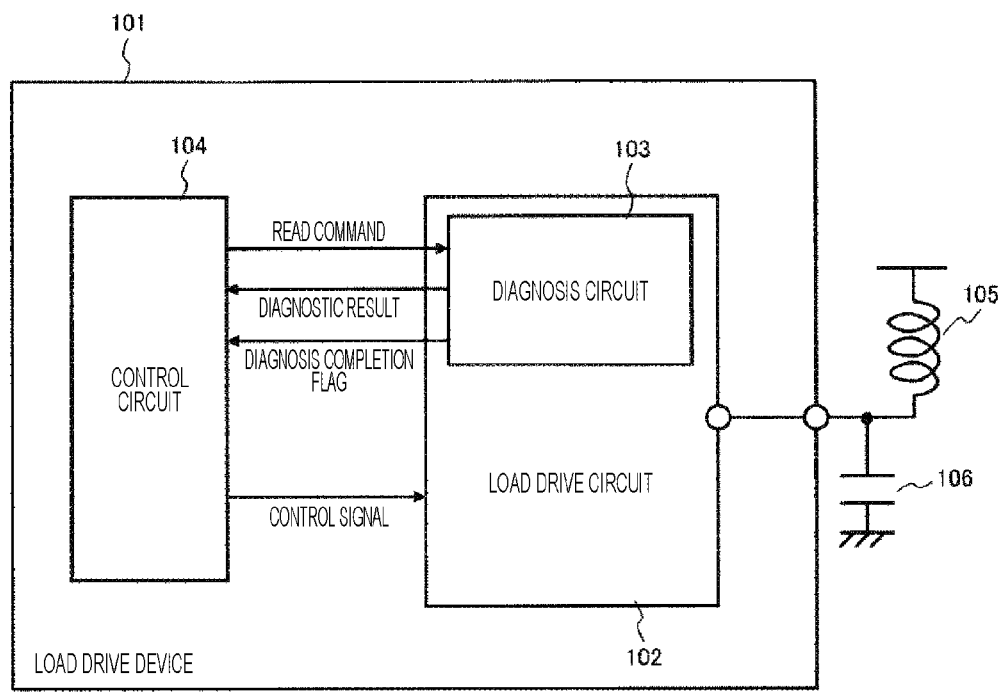
FIG. 1 is a circuit configuration diagram illustrating a configuration of a load drive device according to a first embodiment of the present invention.

Hereinafter, embodiments of the present invention will be described with reference to the drawings. In the drawings, the same configurations are denoted by the same reference signs, and the detailed description of redundant portions will be omitted.

First Embodiment

A load drive device (electronic control unit) according to a first embodiment of the present invention will be described with reference to FIGS. 1 to 5.

FIG. 1 illustrates a circuit configuration of the load drive device (electronic control unit) of the present embodiment. A load drive device 101 of the present embodiment includes a load drive circuit 102 and a control circuit 104 that controls the load drive circuit 102. The load drive circuit 102 includes a diagnosis circuit 103 that diagnoses an output state of the load drive device 101 (load drive circuit 102) and outputs a diagnostic result to the control circuit 104.

The load drive circuit 102 drives a load based on a control signal output from the control circuit 104. FIG. 1 illustrates an example of an inductive load including a winding wire (coil) 105 and a capacitive element (capacitor) 106. The diagnosis circuit 103 diagnoses the output state of the load drive device 101 by monitoring an output voltage or an output current of the load drive circuit 102, and sends (outputs) the diagnostic result and a diagnosis completion flag to the control circuit 104 when a read command is received from the control circuit 104.

The "diagnosis completion flag" is a flag indicating whether or not there is an opportunity to diagnose the output state of the load drive device 101 (load drive circuit 102) by the diagnosis circuit 103.

The diagnosis circuit 103 diagnoses the output state of the load drive device 101 only when the load drive circuit 102 is in an ON or OFF state. For example, when the load drive circuit 102 has a low-side driver configuration, in order to diagnose an abnormality of a disconnection or a ground fault, the diagnosis circuit 103 diagnoses that the output state is a normal state when the output voltage is close to a battery voltage in a period in which the load drive circuit 102 is in the OFF state or an abnormal state of the disconnection or the ground fault when the output voltage is close to a GND potential.

When a supply fault is diagnosed, it is possible to diagnose the supply fault when an excessive current is flowing in a period in which the load drive circuit 102 is ON and a normal state when the current is in a normal range.

Even when the load drive circuit 102 has another circuit configuration such as a high-side driver, the same applies to the following operations as long as a diagnosable period is limited to the ON or OFF state.

The diagnosis circuit 103 generates the diagnosis completion flag based on a period in which the diagnosis is being performed.

Figure 2:
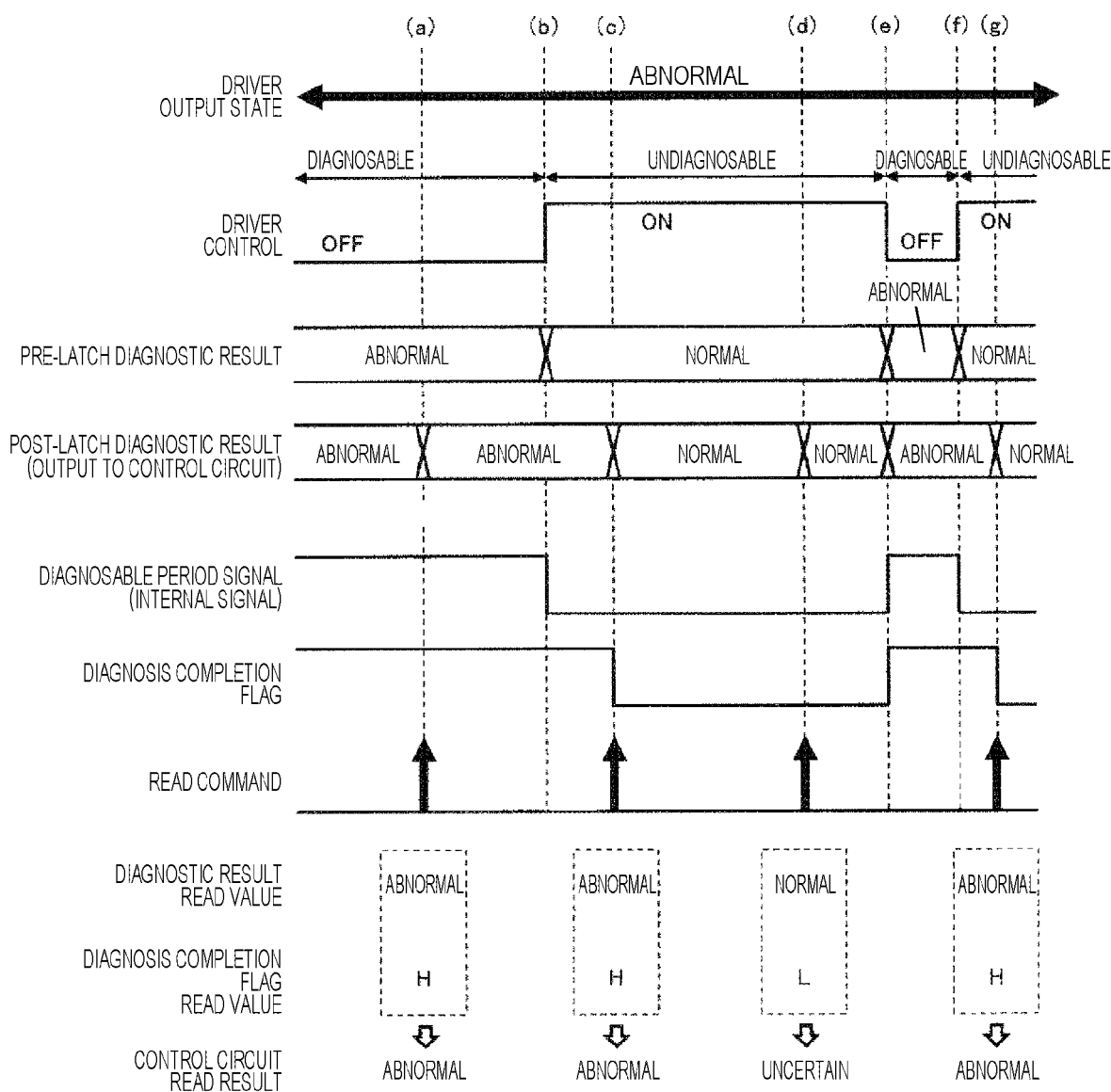
FIG. 2 is a timing chart illustrating an example of an operation of a load drive circuit 102 of FIG. 1.

FIG. 2 illustrates a timing chart when the diagnosis circuit 103 performs the diagnosis only in a period in which the load drive circuit 102 is in the OFF state and a state of an output terminal is "abnormal" in the present embodiment.

A pre-latch diagnostic result in FIG. 2 represents a result of the diagnosis performed by the diagnosis circuit 103 in a diagnosable period in which driver control is Low, that is, in a period in which the load drive circuit 102 is in the OFF state, but is fixed to "normal" which is a default value in an undiagnosable period in which the driver control is High. As illustrated in (e) of FIG. 2, a post-latch diagnostic result representing a register that stores information output to the control circuit 104 stores and latches a value (retains a state) when the pre-latch diagnostic result becomes abnormal. As illustrated in (a), (c), (d), and (g) of FIG. 2, when a read command is received from the control circuit 104, after the read command is transmitted to the control circuit 104, the value of the pre-latch diagnostic result is stored again, and is latched (the state is retained).

By operating in this manner, the result diagnosed by the diagnosis circuit 103 in the diagnosable period is retained until the result is first read by the control circuit 104 after the period is switched to the undiagnosable period as illustrated in (c) of FIG. 2.

As illustrated in (c) of FIG. 2, after the post-latch diagnostic result is cleared by the read command in the undiagnosable period, "normal" which is the default diagnostic result value is stored in the post-latch diagnostic result. Thus, as illustrated in (d) of FIG. 2, when the diagnosis circuit 103 receives the read command again while the undiagnosable period is continued, even though the driver output state is actually "abnormal", a value indicating "normal" (hereinafter, referred to as undiagnosed "normal") is output as the diagnostic result to the control circuit 104.

A diagnosable period signal which is an internal signal of the diagnosis circuit 103 becomes High while the driver control is Low (OFF) which is the diagnosable period and becomes Low while the driver control is High (ON) which is the undiagnosable period.

As illustrated in (e) of FIG. 2, the diagnosis completion flag becomes High and is latched (the state is retained) when the diagnosable period signal becomes High. As illustrated in (a), (c), (d), and (g) of FIG. 2, when the diagnosis circuit 103 receives the read command from the control circuit 104, after the diagnosis completion flag value is transmitted to the control circuit 104, the value of the diagnosable period signal is latched (the state is retained) again.

By such an operation, a diagnosis completion flag High is read when there is the diagnosable period between a previous read command and a current read command, and a diagnosis completion flag Low is read when there is no diagnosable period.

The control circuit 104 determines a read result based on the read diagnostic result and the value of the diagnosis completion flag. When the diagnosis completion flag is High, since it is possible to determine that there is the diagnosis period between the previous reading and the current reading and a diagnostic result read value is a credible result after the diagnosis is performed, the control circuit 104 processes the diagnostic result read value as the read result as it is.

Meanwhile, when the diagnosis completion flag is Low, since the diagnosis is not performed after the previous reading, even though the diagnostic result read value is "normal", the control circuit 104 processes the read result as "uncertain". In other words, the control circuit 104 determines the diagnostic result as "uncertain" when the diagnostic result received from the diagnosis circuit 103 is "normal" and the diagnosis completion flag is Low (no diagnosis opportunity). That is, when it is determined that the diagnostic result is "uncertain", the control circuit 104 ignores the diagnostic result from the diagnosis circuit 103.

FIG. 2 illustrates that the diagnosis circuit 103 performs the diagnosis in a period in which the load drive circuit 102 is in the OFF state. However, even when the diagnosis is performed in a period in which the load drive circuit 102 is ON, it is determined to be diagnosable in a period in which the driver control is High, and it is determined to be undiagnosable in a period in which the driver control is Low. Another signal operates according to a diagnosable or undiagnosable state, and thus, the same effect can be obtained.

It has been described that the diagnosis completion flag is set to High in a period in which the diagnosis is performed and is set to Low in a period in which the diagnosis is not performed. However, the diagnosis completion flag may be set to "Low" in a period in which the diagnosis is performed, and may be set to "High" in a period in which the diagnosis is not performed.

The control circuit 104 finally determines "normal" or "abnormal" of the output based on the diagnostic result read from the diagnosis circuit 103. The control circuit 104 counts the read result of "abnormal" in consideration of a possibility that the diagnosis circuit 103 mistakenly diagnoses "abnormal" due to noise, surge, and the like, and determines that the output is "abnormal" when the abnormal state is continued by a certain number of times.

For example, as illustrated in (b) to (e) of FIG. 2, the diagnosis circuit 103 latches (retains the state) the diagnostic result detected in a period in which the diagnosis of the ON or OFF state of the load drive circuit 102 (driver control) is executed, clears the latched diagnostic result when the control circuit 104 is read, latches the diagnosis completion flag as High in a period in which the diagnosis of the output state of the load drive circuit 102 (driver control) is executed, clears the latched diagnosis completion flag to be Low when the control circuit 104 is read, and outputs a diagnosis completion flag notifying whether or not there is the diagnosis opportunity between the previous reading and the current reading of the diagnostic result to the control circuit 104.

Figure 3:
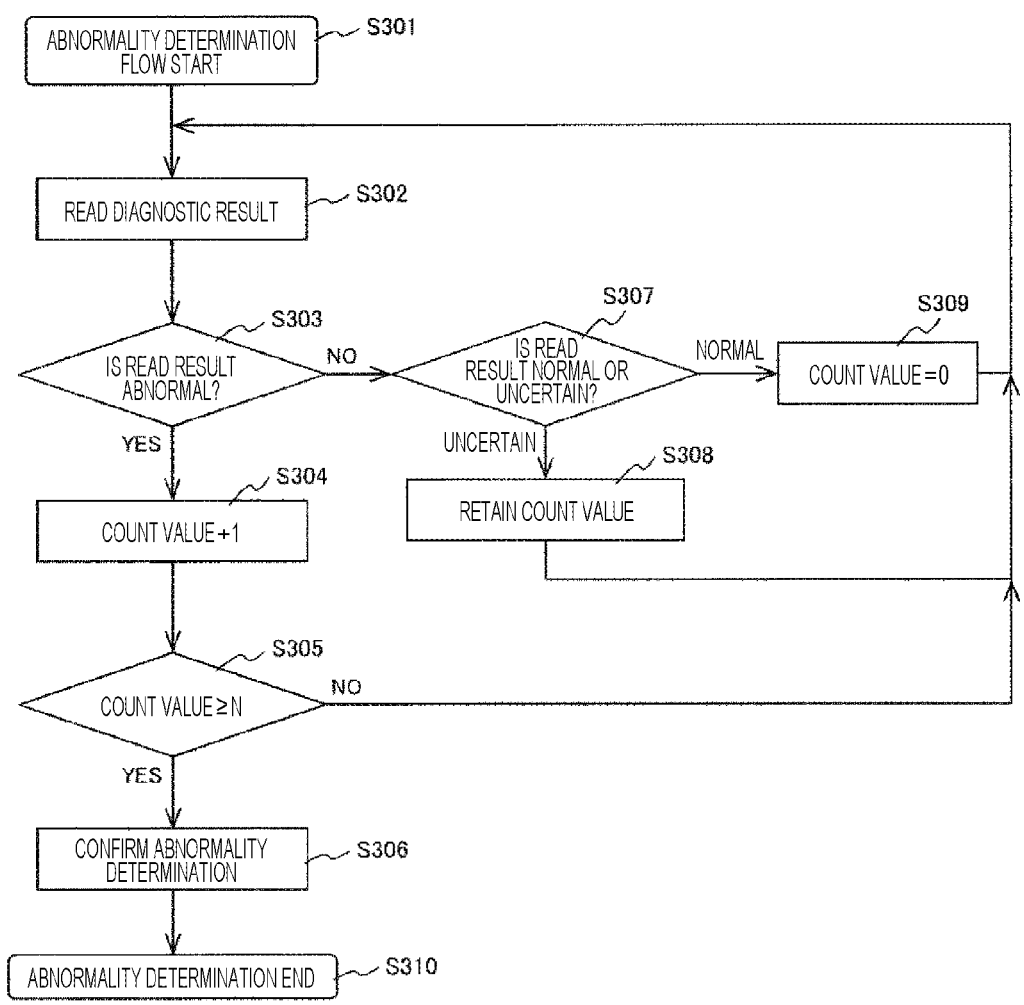
FIG. 3 is a flowchart illustrating an abnormality determination method using a control circuit 104 of FIG. 1.

FIG. 3 illustrates an abnormality determination flow (abnormality determination method) of the final output terminal state by the control circuit 104. The control circuit 104 receives an abnormality determination start signal and starts the abnormality determination flow (step S301).

First, the diagnostic result of the diagnosis circuit 103 is read (step S302), and it is determined whether or not the read result is "abnormal" (step S303). When the read result is "abnormal", 1 is added to the count value (step S304).

Subsequently, it is determined whether or not the count value reaches a certain number of times (N times) (step S305). When the count value does not reach, the processing returns to the reading of the diagnostic result (step S302), and when the count value reaches, the abnormality determination is confirmed (step S306), and the abnormality determination flow is ended (step S310).

Meanwhile, when the read result is not "abnormal" in step S303, it is determined whether the read result is "uncertain" or "normal" (step S307). When the read result is "uncertain", the processing returns to the reading of the diagnostic result while the previous value is retained as the count value (step S308), and when the read result is "normal", the count value is cleared to 0, and the processing returns to the reading of the diagnostic result (step S309).

In the related art, since there is no diagnosis completion flag, there is no flow when the read result illustrated in FIG. 3 is "uncertain", and the count value is always cleared when the read result is not "abnormal". That is, when the output becomes "abnormal" and the undiagnosed "normal" is read while "abnormal" is being read continuously, the continuous reading of "abnormal" is interrupted, and the count needs to be restarted from zero.

As in the present invention, when the diagnostic result read value is "normal", it is possible to distinguish whether the read result is "normal" or "uncertain" by using the diagnosis completion flag. Thus, in the determination using the control circuit 104 when the read result is abnormal, even though the undiagnosed "normal" is read while "abnormal" is being read continuously, it is not necessary to restart the count by determining that the read result is "uncertain" and retaining the count number of abnormal reading, and it is possible to shorten a time required for the abnormality determination using the control circuit 104.

Under conditions in which a drive cycle of the load is long and a duty ratio is small (large when the diagnosis is performed in which a period in which the driver control is ON), diagnosable opportunities are small compared to intervals at which the read commands are issued. In the related art, when it is difficult to continuously read the abnormal diagnostic result or when there is no diagnosable period between the read commands, since all the read results are ignorable as "uncertain" (not used as a final determination material of the control circuit 104), the reading of "abnormal" can be continuously counted. Thus, since the abnormality can be determined by the control circuit 104, the effect is especially great.

Figure 4:
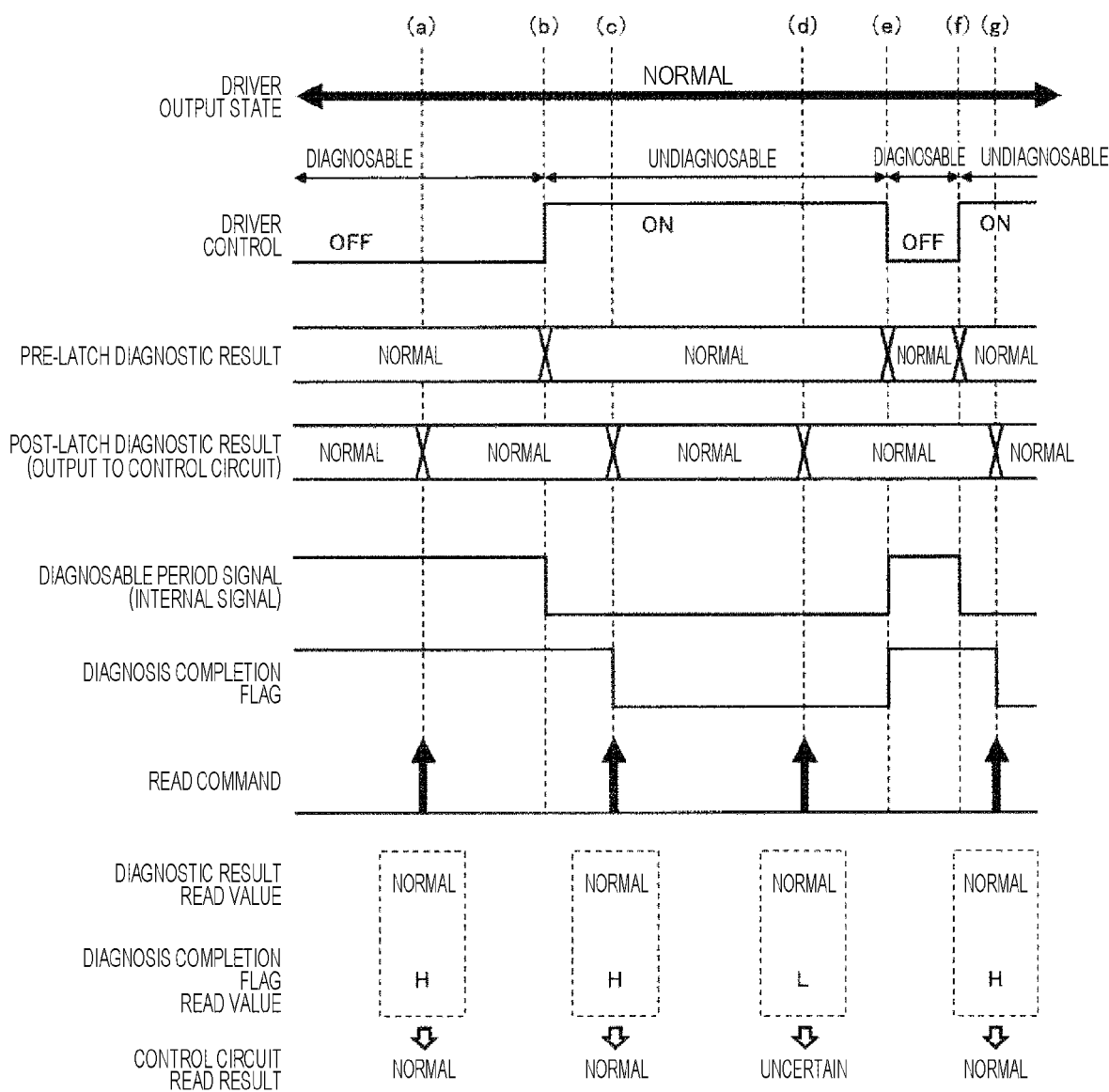
FIG. 4 is a timing chart illustrating an example of the operation of the load drive circuit 102 of FIG. 1.

FIG. 4 illustrates a timing chart when the diagnosis circuit 103 performs the diagnosis only in a period in which the load drive circuit 102 is in the OFF state and the state of the output terminal is "normal" in the present embodiment. An operation principle of each signal is the same as that illustrated in FIG. 2, but the pre-latch diagnostic result, the post-latch diagnostic result, and the diagnostic result read value are constantly normal in FIG. 4.

Of these signals, when there is the diagnosable period between the previous and current read commands (read commands) as illustrated in (a), (c), and (g) of FIG. 4, "normal" which is the result of the diagnosis performed by the diagnosis circuit 103 is read, but when there is no diagnosable period as illustrated in (d) of FIG. 4, the undiagnosed "normal" is output. However, since a diagnosis completion flag read value in (d) of FIG. 4 is Low, the control circuit 104 can determine that the undiagnosed "normal" is not the result of the diagnosis performed by the diagnosis circuit 103, and the read result can be processed as "uncertain".

Even though the output terminal is in the "normal" state, the same effect can be obtained when the diagnosis circuit 103 performs the diagnosis in a period in which the load drive circuit 102 is ON as in the description of FIG. 2.

When the control circuit 104 determines to be "normal" based on the read result from the diagnosis circuit 103, since the diagnosis completion flag is not used in the related art and the undiagnosed "normal" and "normal" which is the diagnostic result of the diagnosis circuit 103 cannot be distinguished, it is determined to be "normal" when "normal" is continuously read by a certain number of times in consideration of the possibility that the normal state is undiagnosed even though "normal" is read as in the case of the abnormality determination.

In the present embodiment, since "normal" and "uncertain" of the read result can be reliably discriminated, the continuous reading described above becomes unnecessary, and it is possible to determine to be "normal" with one read result. Thus, it is possible to shorten a determination time.

As in the case of the abnormal determination, when an opportunity to output the undiagnosed "normal" increases under conditions in which a drive cycle of the load is long and a duty ratio is small (large when the diagnosis is performed in a period in which the driver control is ON), since a read value of the probabilistically sufficient number of times of the "normal" reading is required for the determination using the control circuit 104 in the related art, it takes more time. Thus, according to the present embodiment, the effect of determining "normal" becomes greater as the diagnosis opportunities are smaller.

In FIGS. 2 and 4, the diagnosable period and the undiagnosable period are switched at the same timing as a rise edge and a fall edge of the driver control. However, in an actual product (load drive device), the diagnosable period may not match the period in which the driver control is High or Low such as a case where a filter time for noise removal is prepared or a time to control a voltage at the time of the disconnection by a small current is prepared in order to distinguish between disconnection and the ground fault or the supply fault.

Figure 5:
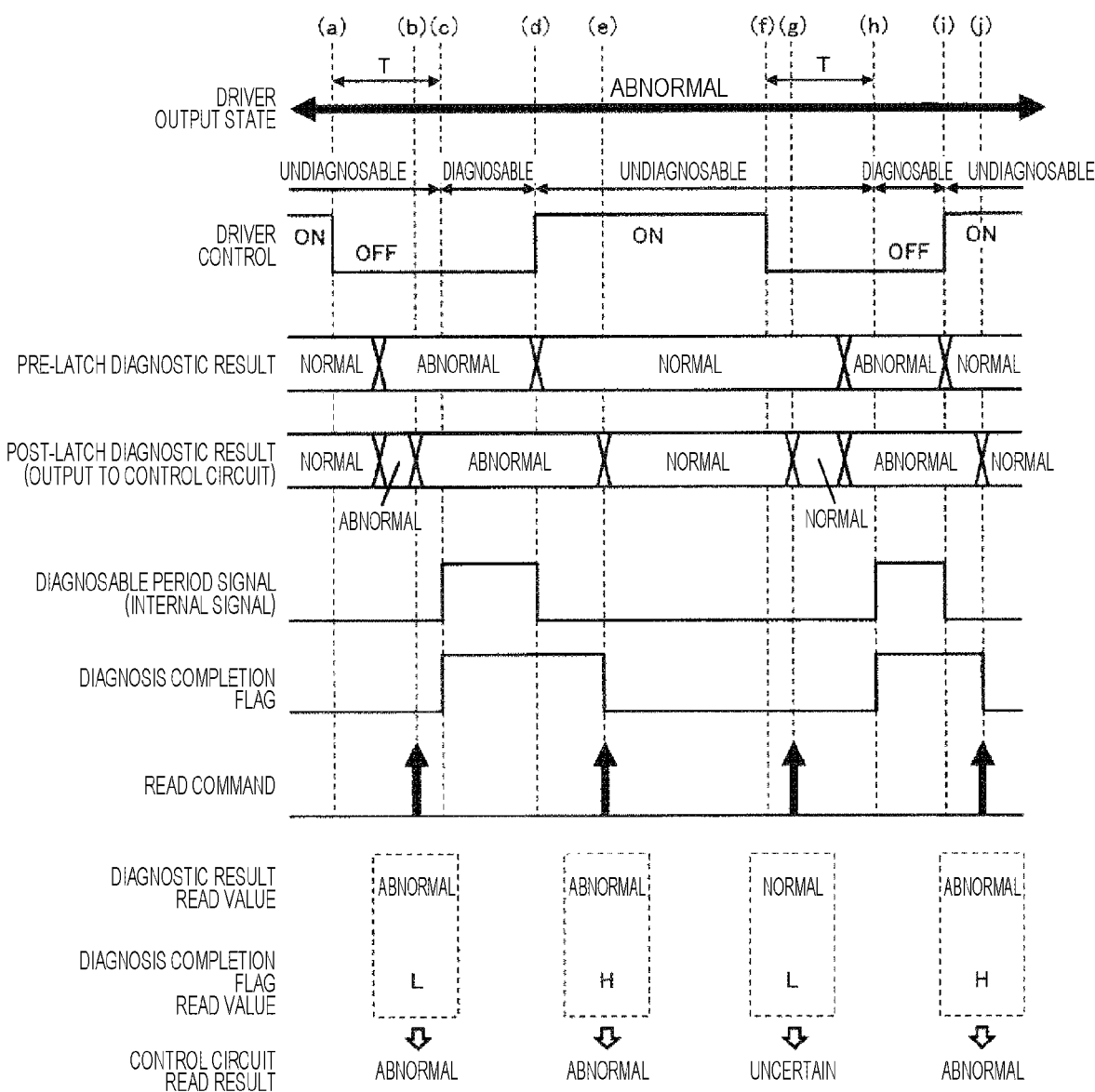
FIG. 5 is a timing chart illustrating an example of the operation of the load drive circuit 102 of FIG. 1.

FIG. 5 illustrates a timing chart when the diagnosis circuit 103 performs the diagnosis only in a period in which the load drive circuit 102 is in the OFF state, it takes a certain time to complete the diagnosis, and the state of the output terminal is "abnormal" in the present embodiment. Even though the driver control is Low, there is a possibility that the diagnosis is not be completed for a maximum time T required by the diagnosis circuit 103 for the diagnosis from the fall edge of the driver control at which the diagnosis circuit 103 starts the diagnosis.

Thus, as illustrated between (a) to (c) and (d) to (f) of FIG. 5, this period is the undiagnosable period, and the diagnosable period signal becomes Low. When the time T elapses from the fall edge of the driver control, since the diagnosis of the diagnosis circuit 103 is reliably completed, it is determined to be diagnosable, and the diagnosable period signal becomes High as illustrated in (c) and (h) of FIG. 5.

For example, as illustrated in (f) to (j) in FIG. 5, the diagnosis circuit 103 raises the diagnosis completion flag to High after a predetermined period (T) elapses from when the load drive circuit 102 (driver control) shifts to the OFF state, and lowers the diagnosis completion flag to Low when a control state of the load drive circuit 102 (driver control) is switched and the diagnosis of the output state of the load drive circuit 102 (driver control) is ended.

The diagnosis circuit 103 raises the diagnosis completion flag to High after the predetermined period (T) elapses from when the load drive circuit 102 (driver control) shifts of the OFF state, and lowers the diagnosis completion flag to Low when a transmission request (read command) of the diagnostic result is received from the control circuit 104 after the control state of the load drive circuit 102 (driver control) is switched and the diagnosis of the output state of the load drive circuit 102 (driver control) is ended.

Meanwhile, as described above, when the diagnosis circuit 103 performs the diagnosis in a period in which the load drive circuit 102 (driver control) is ON, the diagnosis circuit 103 raises the diagnosis completion flag to High after the predetermined time (T) elapses from when the load drive circuit 102 (driver control) of the diagnosis circuit 103 shifts to the ON state, and lowers the diagnosis completion flag to Low when the control state of the load drive circuit 102 (driver control) is switched and the diagnosis of the output state of the load drive circuit 102 (driver control) is ended.

The diagnosis circuit 103 raises the diagnosis completion flag to High after the predetermined period (T) elapses from when the load drive circuit 102 (driver control) shifts to the ON state, and lowers the diagnosis completion flag to Low when the transmission request (read command) of the diagnostic result is received from the control circuit 104 after the control state of the load drive circuit 102 (driver control) is switched and the diagnosis of the output state of the load drive circuit 102 (driver control) is ended.

Accordingly, as illustrated in (g) of FIG. 5, even though the driver control is Low and the diagnostic result read value is "normal", the diagnosis completion flag becomes Low in a period in which there is a possibility that the diagnosis is not completed, and the control circuit 104 processes the read result as "uncertain".

The diagnosis using the diagnosis circuit 103 may be completed even before the time T elapses from the fall edge of the driver control.

At this time, as illustrated in (b) of FIG. 5, there is a possibility that the diagnostic result read value becomes "abnormal" in the undiagnosable period in which the driver control is Low. However, at this time, even though the diagnosis completion flag is Low, the control circuit 104 processes the read result as "abnormal". As stated above, when the diagnosable period is not synchronized with the driver control, the diagnosable period signal may be operated according to the timing in the diagnosable period.

In order to distinguish the undiagnosed "normal" from "normal" reflecting the result of the diagnosis performed by the diagnosis circuit 103, the control circuit 104 can perform processing of determining whether or not there is the diagnosable period from the transmission of the previous read command by storing and collating a period in which the load drive circuit 102 is turned ON and a period in which the load drive circuit is turned OFF according to control signals with a timing at which the read command is transmitted in addition to the method of using the diagnosis completion flag as in the present embodiment. However, this method suppresses a processing capability of the control circuit 104.

As described above, according to the load drive device (electronic control unit) of the present embodiment, it is possible to shorten a time required for determining the output state of the load drive device 101 without suppressing the processing capacity of the control circuit 104.

Accordingly, in the load drive device (electronic control unit) having a failure diagnosis function, it is possible to realize the electronic control device capable of performing a high-accurate failure diagnosis in a short time.

The control circuit 104 can continue the normal control of the load drive circuit 102 when the final determination result of the output state of the load drive circuit 102 based on the diagnostic result and the diagnosis completion flag is "normal", and can perform control such that the load drive circuit 102 is stopped when the final determination result is "abnormal".

By performing such control, a stable control operation can be performed without stopping the load drive device (electronic control unit) more than necessary, and the reliability of the load drive device (electronic control unit) is improved.

Notification means such as a warning light for notifying an "abnormality" of the load drive device (electronic control unit) 101 may be provided inside or outside the load drive device (electronic control unit) 101, and the control circuit 104 may turn on the warning light (notify the outside) when the final determination result of the output state of the load drive circuit 102 based on the diagnostic result and the diagnosis completion flag is "abnormal".

This leads to early detection of an "abnormality" of the load drive device (electronic control unit) 101, and appropriate maintenance (repair/replacement) of the load drive device (electronic control unit) 101 can be performed.

Second Embodiment

A load drive device (electronic control unit) according to a second embodiment of the present invention will be described with reference to FIG. 6. Since a circuit configuration diagram in the present embodiment is common to FIG. 1 in the first embodiment, the redundant description will be omitted.

Figure 6:
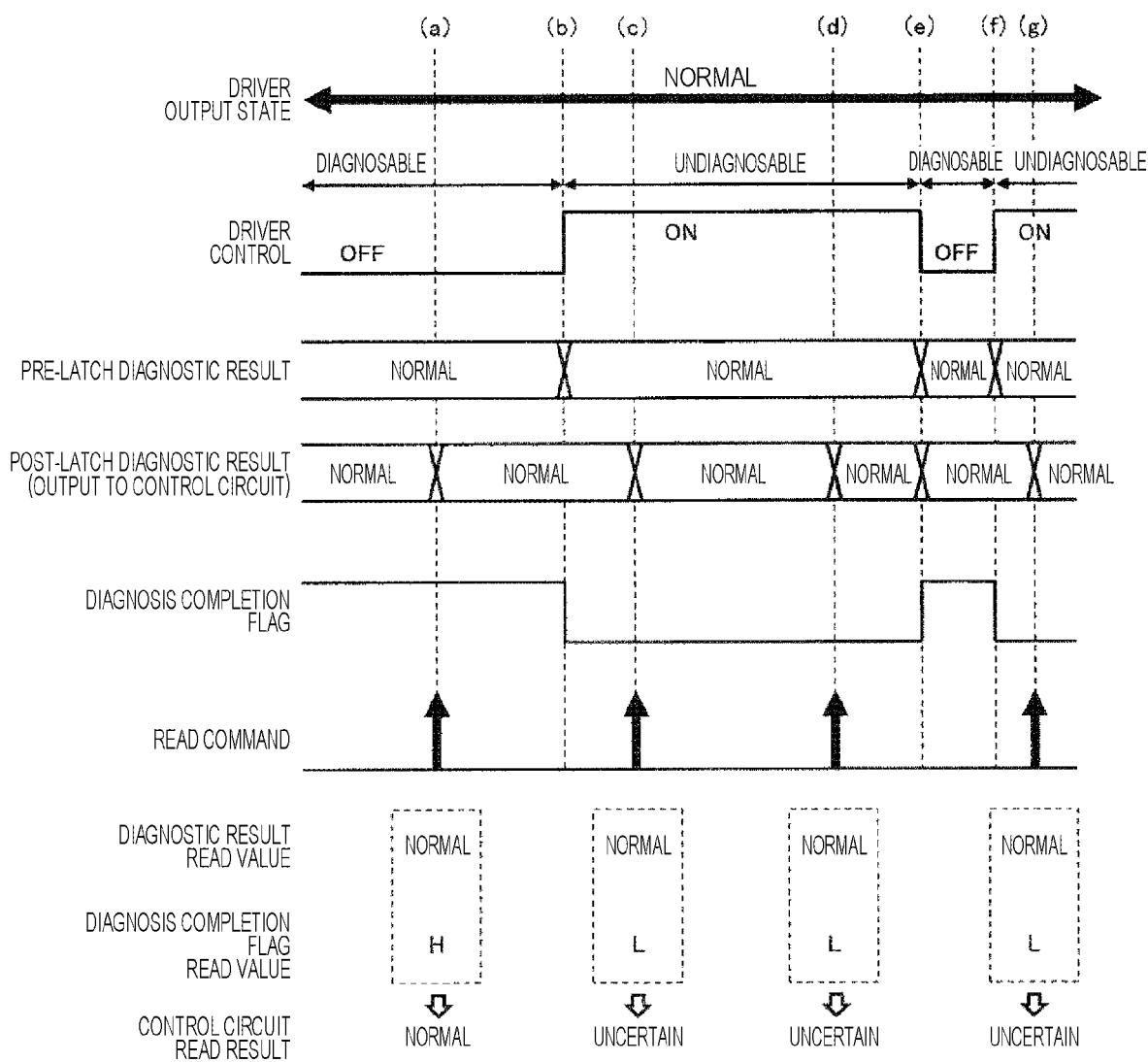
FIG. 6 is a timing chart illustrating an example of an operation of a load drive circuit according to a second embodiment of the present invention.

FIG. 6 is a timing chart illustrating an operation of the load drive circuit 102 in the present embodiment.

While there is the diagnosable period signal and the operation in which the diagnosis completion flag is High in the diagnosable period and is Low in the undiagnosable period in the first embodiment, there is no diagnosable period signal and the diagnosis completion flag has the same operation as the diagnosable period signal in the first embodiment in the present embodiment.

That is, the diagnosis completion flag is not latched (the state is not maintained) even after becoming High, and falls immediately at the time of entering the undiagnosable period. In this case, the diagnosis completion flag notifies whether or not a point in time at which the control circuit 104 reads the diagnostic result is the diagnosable period. In the present embodiment, the control circuit 104 determines that the diagnostic result of "normal" confirmed in the diagnosable period is "uncertain" as illustrated in (c) and (g) of FIG. 6, but can reliably determine that the undiagnosed "normal" is "uncertain" as illustrated in (d) of FIG. 6.

FIG. 6 illustrates a case where the output state of the load drive device 101 is "normal". However, in the case of "abnormal", when the diagnostic result read value is "abnormal" and the diagnosis completion flag read value is Low, since the diagnostic result becomes "abnormal" only when the diagnosis circuit 103 detects "abnormality" of the output, the control circuit 104 determines that the read result is "abnormal".

Since the diagnostic result read value becomes "normal" only when the undiagnosable period is continued from the reading, the diagnosis completion flag becomes Low, and it is possible to determine that the read result is "uncertain". Thus, when the output state of the load drive device 101 is "abnormal", the present embodiment can obtain the same effect as that of the first embodiment.

In FIG. 6, the diagnosable period coincides with a period in which the driver control is Low. However, the same effect is obtained by setting the diagnosis completion flag to High according to the diagnosable period even when the diagnosis is performed in a period in which the driver control is High and the diagnosable period and the undiagnosable period deviate temporally from the driver control.

Third Embodiment

Figure 7:
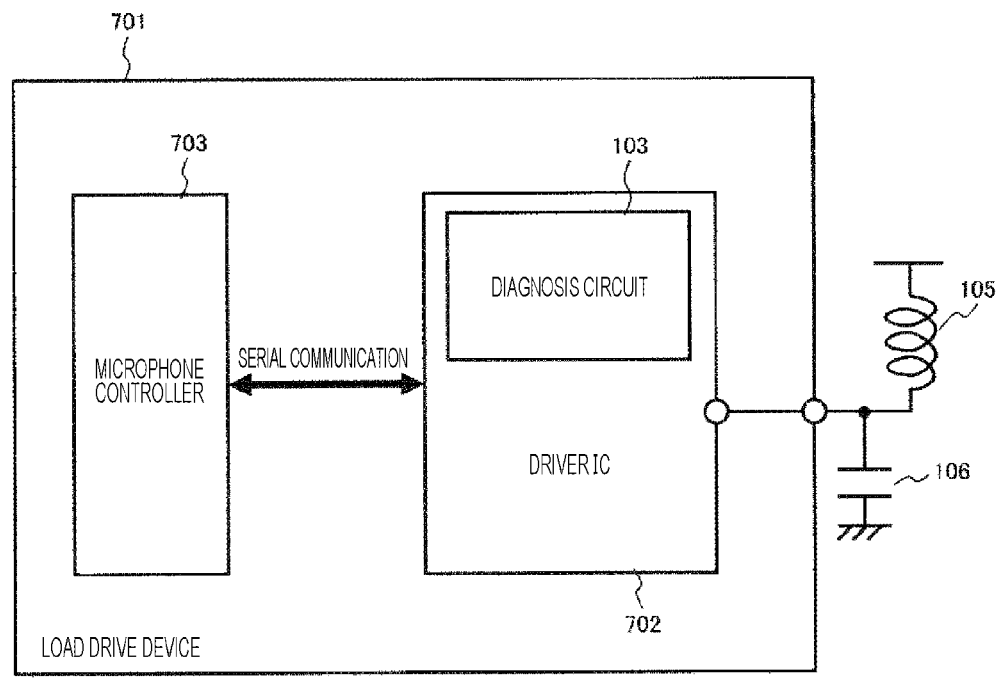
FIG. 7 is a circuit configuration diagram illustrating a configuration of a load drive device according to a third embodiment of the present invention.

A load drive device (electronic control unit) according to a third embodiment of the present invention will be described with reference to FIG. 7. FIG. 7 is a circuit configuration diagram of the load drive device (electronic control unit) in the present embodiment.

In the present embodiment, configurations of a driver IC 702 and a microcontroller 703 are different from those in the first embodiment. Since the other configurations are the same as those in the first embodiment, the redundant description will be omitted.

In a load drive device (electronic control unit) 701 of the present embodiment, the control circuit 104 is replaced with the microcontroller 703 and the load drive circuit 102 is replaced with the driver IC 702 with respect to the configuration of the first embodiment. Communication between the microcontroller 703 and the driver IC 702 is serial communication.

In the present embodiment, all the control signal, the read command, the diagnostic result, and the diagnosis completion flag are transmitted and received via serial communication as illustrated in FIG. 7. For example, the diagnosis circuit 103 transmits the diagnostic result and the diagnosis completion flag to the microcontroller 703 (control circuit) via serial communication.

According to the present embodiment, the number of ports of the driver IC 702 and the microcontroller 703 can be reduced. Accordingly, a failure probability such as disconnection is reduced, and the reliability of the load drive device (electronic control unit) 701 can be improved.

Further, by including the diagnostic result and the diagnosis completion flag in the same frame and transmitting the diagnostic result to the microcontroller 703 (control circuit), the microcontroller 703 (control circuit) can judge the read result more quickly.

Fourth Embodiment

Figure 8:
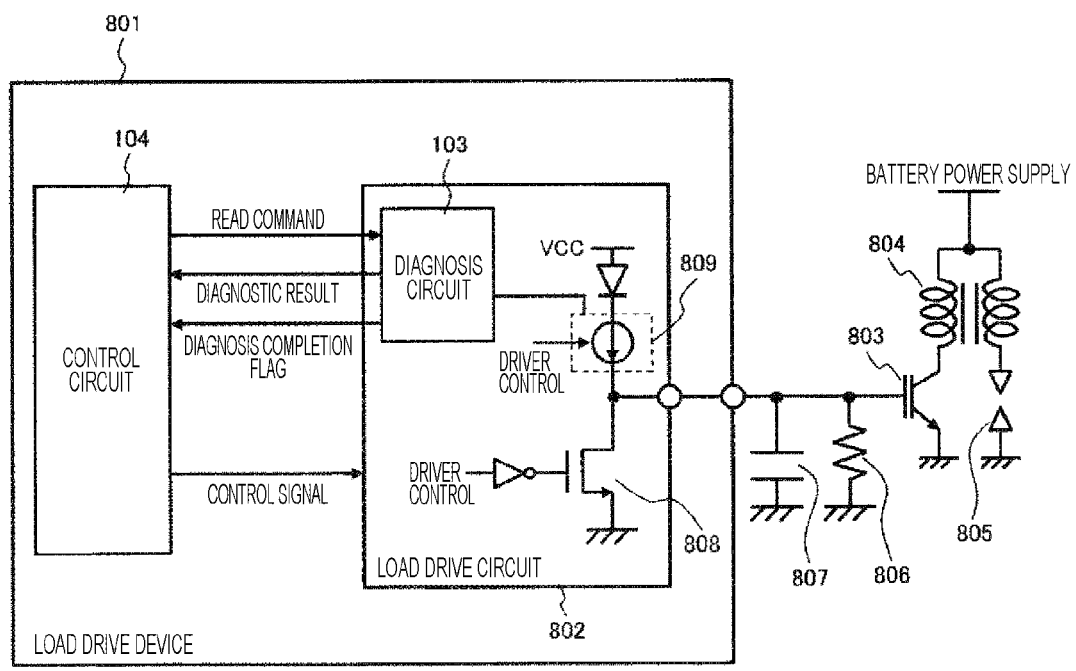
FIG. 8 is a circuit configuration diagram illustrating a configuration of a load drive device according to a fourth embodiment of the present invention.

A load drive device (electronic control unit) according to a fourth embodiment of the present invention will be described with reference to FIG. 8. FIG. 8 is a circuit configuration diagram of the load drive device (electronic control unit) in the present embodiment.

In the present embodiment, configurations of a low-side driver 808, a high-side driver 809, an igniter 803, an ignition coil 804, and a spark plug 805 are different from those of the first embodiment. Since the other configurations are the same as those in the first embodiment, the redundant description will be omitted.

In the present embodiment, a load drive device (electronic control unit) 801 operates as a pre-driver of the igniter 803, and when the driver control is High, a VCC voltage is output while an output current is controlled by setting the high-side driver 809 to ON and the low-side driver 808 to OFF. That is, a load drive circuit 802 drives the igniter 803.

When the driver control is Low, an output is set to GND by setting the low-side driver 808 to ON and the high-side driver 809 to OFF. Energy of the ignition coil 804 is stored by setting the igniter 803 to ON when the output of the load drive load device 801 becomes VCC. When the output of the load drive device 801 becomes GND, the energy of the ignition coil 804 is released by setting the igniter 803 to OFF, and the spark plug 805 generates a spark. A resistance element 806 and a capacitance element (capacitor) 807 are connected to a wiring connecting the load drive device 801 and the igniter 803.

The diagnosis circuit 103 monitors a current output by the high-side driver 809, and detects that the output of the load drive device 801 is disconnected when the current is equal to or less than a certain level.

A drive cycle of the igniter 803 depends on an engine speed, and as the engine speed becomes lower, the cycle becomes longer. Since a period in which the igniter 803 is ON at this time is shorter than the drive cycle, a period in which the diagnosis circuit 103 can be diagnosed is also shortened. For example, when the engine speed is 800 rpm, the drive cycle is about 120 ms. When a cycle at which the read command is issued by the control circuit 104 is 10 ms, the diagnosis circuit 103 performs the diagnosis once in 12 times of the cycle at which the read command is issued.

As described in the first embodiment, the undiagnosed "normal" can be determined as "uncertain" by using the diagnosis completion flag, and the final determination of "abnormal" or "normal" of the output state using the control circuit 104 can be determined. However, this effect is especially great when the diagnosable opportunities are small such as a case where the drive cycle is long and the duty ratio is low and it is difficult to perform the determination in the related art.

When the igniter 803 is driven as a load as in the present embodiment, the diagnosis can be more quickly completed especially when the engine speed is low. The same applies to other cases where a load of which a drive cycle of an injector (fuel injection device) and a duty ratio depend on environments such as an engine speed and a temperature, and it is possible to perform the diagnosis that is not influenced by a driving state of a vehicle and an environment by using the diagnosis completion flag.

Although not illustrated in FIG. 8, it is also possible to drive the igniter by connecting the load drive circuit 802 to the injector (fuel injection device) of the engine.

Fifth Embodiment

Figure 9:
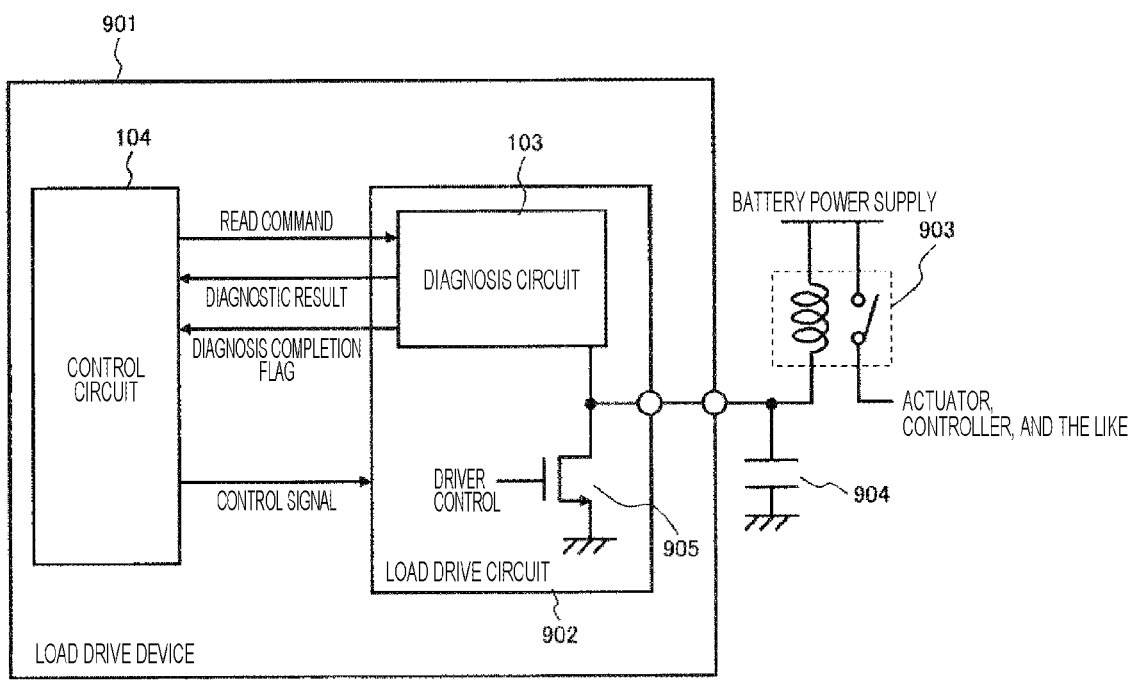
FIG. 9 is a circuit configuration diagram illustrating a configuration of a load drive device according to a fifth embodiment of the present invention.

A load drive device (electronic control unit) according to a fifth embodiment of the present invention will be described with reference to FIG. 9. FIG. 9 is a circuit configuration diagram of the load drive device (electronic control unit) in the present embodiment.

In the present embodiment, configurations of a low-side driver 905 and a relay 903 are different from those in the first embodiment.

Since the other configurations are the same as those in the first embodiment, the redundant description will be omitted.

In the present embodiment, a load drive circuit 902 drives a relay 903. When the low-side driver 905 is ON, the relay 903 is also ON, and a battery power is supplied to circuits such as an actuator and a controller connected to an end of the relay 903. In such a configuration, there is an extremely small opportunity to switch the drive state such as a case where a power continues to be supplied to other circuits by setting the low-side driver 905 and the relay 903 to ON from when the vehicle starts to when the vehicle stops. Thus, there is almost no opportunity to perform the diagnosis only while the driver control is in the OFF state.

As stated above, when the drive state of the load drive circuit 902 hardly changes or when the drive cycle is extremely long and the read result is continued in the state of "uncertain" for a certain period, it is possible to forcibly create a diagnosis opportunity by switching between the ON and OFF states of the load drive circuit 902 for a time shorter than in a case where the load operates mechanically.

For example, in the case of the present embodiment, when a mechanical relay is used for the relay 903, since a response time is generally several ms, the diagnosis may be performed by turning off the relay for a period of about several hundred μs or less.

That is, the control circuit 104 controls the load drive circuit 902 such that the diagnosis circuit 103 can diagnose the output state of the load drive circuit 902 when the diagnosis completion flag indicates that there is no diagnosis period for a predetermined period or longer.

The present invention is not limited to the aforementioned embodiments, and includes various modification examples.

For example, the aforementioned embodiments are described in detail in order to facilitate easy understanding of the present invention, and are not limited to necessarily include all the described components. Some of the components of a certain embodiment can be substituted into the components of another embodiment, and the components of another embodiment can be added to the component of a certain embodiment. In addition, the components of another embodiment can be added, removed, and substituted to, from, and into some of the components of the aforementioned embodiments.

REFERENCE SIGNS LIST

101, 701, 801, 901 load drive device (electronic control unit)
102, 802, 902 load drive circuit
103 diagnosis circuit
104 control circuit
105 winding wire (coil)
106, 807, 904 capacitance element (capacitor)
702 driver IC
703 microcontroller
808, 905 low-side driver
809 high-side driver
803 igniter
804 ignition coil
805 ignition plug
806 resistance element
903 relay

The invention claimed is:

1. An electronic controller comprising:
    a load drive circuit configured to drive a load;
    a control circuit configured to control the load drive circuit; and
    a diagnosis circuit configured to diagnose an output state of the load drive circuit, and output a diagnostic result to the control circuit,
    wherein the diagnosis circuit is configured to output a diagnosis completion flag indicating whether or not there is a diagnosis opportunity to the control circuit.

2. The electronic controller according to claim 1, wherein the control circuit is configured to determine that the diagnostic result is uncertain when the diagnostic result from the diagnosis circuit is normal and the diagnosis completion flag indicates that there is no diagnosis opportunity.

3. The electronic controller according to claim 2, wherein the control circuit is configured to ignore the diagnostic result from the diagnosis circuit when it is determined that the diagnostic result is uncertain.

4. The electronic controller according to claim 1, wherein the control circuit is configured to raise the diagnosis completion flag to High after a predetermined period elapses from when the load drive circuit shifts to an OFF state, and lower the diagnosis completion flag to Low when a control state of the load drive circuit is switched and the diagnosis of the output state of the load drive circuit is ended.

5. The electronic controller according to claim 1, wherein the control circuit is configured to raise the diagnosis completion flag to High after a predetermined period elapses from when the load drive circuit shifts an ON state, and lower the diagnosis completion flag to Low when a control state of the load drive circuit is switched and the diagnosis of the output state of the load drive circuit is ended.

6. The electronic controller according to claim 1, wherein the control circuit is configured to raise the diagnosis completion flag to High after a predetermined period elapses from when the load drive circuit shifts an OFF state, and lower the diagnosis completion flag to Low when a transmission request of the diagnostic result is received from the control circuit after a control state of the load drive circuit is switched and the diagnosis of the output state of the load drive circuit is ended.

7. The electronic controller according to claim 1, wherein the control circuit is configured to raise the diagnosis completion flag to High after a predetermined period elapses from when the load drive circuit shifts an ON state, and lower the diagnosis completion flag to Low when a transmission request of the diagnostic result is received from the control circuit after a control state of the load drive circuit is switched and the diagnosis of the output state of the load drive circuit is ended.

8. The electronic controller according to claim 1, wherein the control circuit latches a diagnostic result detected in a period in which the diagnosis of the ON or OFF state of the load drive circuit is executed, and clears the latched diagnostic result when the control circuit is read, and outputs a diagnosis completion flag for notifying whether or not there is a diagnosis opportunity between previous reading and current reading of the diagnostic result to the control circuit by latching the diagnosis completion flag as High in a period in which the diagnosis of the output state of the load drive circuit is executed and clearing the latched diagnosis completion flag to be Low when the control circuit is read.

9. The electronic controller according to claim 2, wherein the control circuit continues to perform normal control of the load drive circuit when a final determination result of the output state of the load drive circuit based on the diagnostic result and the diagnosis completion flag is normal, and stops the load drive circuit when the final determination result is abnormal.

10. The electronic controller according to claim 1, wherein the diagnosis circuit is configured to transmit the diagnostic result and the diagnosis completion flag to the control circuit via serial communication.

11. The electronic controller according to claim 10, wherein the diagnostic result and the diagnosis completion flag are transmitted to the control circuit in the same frame.

12. The electronic controller according to claim 2, wherein the control circuit turns on and off a warning light when a final determination result of the output state of the load drive circuit based on the diagnostic result and the diagnosis completion flag is abnormal.

13. The electronic controller according to claim 1, wherein the control circuit controls the load drive circuit such that the diagnosis circuit is able to execute the diagnosis of the output state of the load drive circuit when the diagnosis completion flag indicates that there is no diagnosis period for a predetermined period or longer.

14. The electronic controller according to claim 1, wherein the load drive circuit is configured to drive an igniter.

15. The electronic controller according to claim 1, wherein the load drive circuit is configured to drive a relay.

* * * * *